(12) United States Patent
Choi

(10) Patent No.: US 11,961,947 B2
(45) Date of Patent: Apr. 16, 2024

(54) SUBSTRATE FOR MANUFACTURING DISPLAY DEVICE, DISPLAY DEVICE AND MANUFACTURING METHOD THEREOF

(71) Applicant: LG ELECTRONICS INC., Seoul (KR)

(72) Inventor: Hwanjoon Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 267 days.

(21) Appl. No.: 17/349,229

(22) Filed: Jun. 16, 2021

(65) Prior Publication Data

US 2021/0391510 A1   Dec. 16, 2021

(30) Foreign Application Priority Data

Jun. 16, 2020   (KR) ........................ 10-2020-0072971

(51) Int. Cl.
*H01L 33/50* (2010.01)
*H01L 27/146* (2006.01)
*H10K 50/86* (2023.01)

(52) U.S. Cl.
CPC ...... *H01L 33/502* (2013.01); *H01L 27/14621* (2013.01); *H10K 50/865* (2023.02)

(58) Field of Classification Search
CPC ............ H01L 33/502; H01L 27/14621; H01L 33/504; H01L 33/62; H01L 33/44; H01L 25/0753; H01L 2933/0041; H01L 27/156; H01L 33/20; H10K 50/865
See application file for complete search history.

(56) References Cited

U.S. PATENT DOCUMENTS

| 2015/0171372 | A1* | 6/2015 | Iwata | H10K 50/854 |
| | | | | 257/89 |
| 2015/0228869 | A1* | 8/2015 | Yoo | G02F 1/133609 |
| | | | | 362/97.3 |
| 2017/0287887 | A1* | 10/2017 | Takeya | H01L 25/0753 |
| 2022/0085114 | A1* | 3/2022 | Seong | H10K 59/38 |

* cited by examiner

*Primary Examiner* — Jonathan Han
(74) *Attorney, Agent, or Firm* — Birch, Stewart, Kolasch & Birch, LLP

(57) ABSTRACT

Disclosed herein is a transfer substrate used for manufacturing a display device using a light emitting semiconductor device. The transfer substrate include a base substrate, and a divided unit phosphor structure arranged on the base substrate and transferred onto the light emitting semiconductor device.

13 Claims, 25 Drawing Sheets

(a)

(b)

(c)

SUBSTRATE FOR MANUFACTURING DISPLAY DEVICE, DISPLAY DEVICE AND MANUFACTURING METHOD THEREOF

This application claims the benefit of Korean Patent Application No. 10-2020-0072971, filed on Jun. 16, 2020, which is hereby incorporated by reference as if fully set forth herein.

BACKGROUND OF THE DISCLOSURE

Field of the Disclosure

The present disclosure is applicable to a technical field related to display devices, and relates to, for example, a method of manufacturing a display device using a light emitting diode (LED), and a transfer substrate used to manufacture the display device.

Discussion of the Related Art

Recently, in the field of display technology, a display device having excellent characteristics in terms of thinness and flexibility has been developed. On the other hand, currently commercialized major displays are represented by a liquid crystal display (LCD) and organic light emitting diodes (OLED).

However, in the case of the LCD, the response time is not sufficiently short and it is difficult to implement a flexible display. In the case of the OLED, the lifespan of the OLED is short and the mass production yield thereof is not good.

A light emitting diode (LED) is a light emitting semiconductor device that is well known for converting electric current into light Red LEDs using GaAsP compound semiconductors began to be commercialized in 1962, and have been used as light sources along with GaP:N-based green LEDs for image display on electronic devices including information and communication devices. Accordingly, one solution to the above-described issues may be to implement a display using the light emitting semiconductor device. The light emitting semiconductor device has various advantages, such as a long lifespan, low power consumption, excellent characteristics related to initial driving, and high resistance against vibration, compared to a filament-based light emitting device.

In this regard, when the down conversion method employing a phosphor is used, a partition wall structure is required to prevent a color conversion layer from causing color mixing.

Such a structure may be implemented in a low-resolution application.

However, in a high-resolution application, it is difficult to form a partition wall structure and a phosphor pattern.

Accordingly, the present disclosure provides a transfer substrate for manufacturing a display device capable of forming a partition wall structure and a phosphor pattern applicable even to high-resolution applications, and a display device.

SUMMARY OF THE DISCLOSURE

An object of the present disclosure is to provide a transfer substrate for manufacturing a display device, including a phosphor structure capable of divisional transfer.

Another object of the present disclosure is to provide a display device capable of forming a phosphor pattern in transferring a transfer substrate including a phosphor structure onto a light emitting semiconductor device, and a method of manufacturing the same.

Another object of the present disclosure is to address various issues not mentioned herein. The objects of the present disclosure will be understood by those skilled in the art through the whole spirit of the specification and drawings.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a transfer substrate used for manufacturing a display device using a light emitting semiconductor device may include a base substrate; and a phosphor conversion layer arranged on the base substrate, the phosphor conversion layer including a divided unit phosphor structure transferred onto the light emitting semiconductor device.

The unit phosphor structure may include a phosphor, a phosphor binder configured to fix the phosphor, and a color filter arranged between the base substrate and the phosphor binder, The color filter may be arranged to surround a contact surface of the phosphor binder facing the base substrate and at least a portion of a side surface of the phosphor binder adjacent to the contact surface.

The phosphor may include at least one of an organic phosphor, quantum dots, or an inorganic phosphor.

The inorganic phosphor may have a size less than or equal to 20 μm and greater than or equal to 5 μm.

A side surface of the unit phosphor structure may be coated with a reflective film or a color filter.

The transfer substrate may further include a light absorption layer arranged between the unit phosphor structure and the base substrate.

In another aspect of the present disclosure, a display device using a light emitting semiconductor device may include a wiring substrate, at least one light emitting semiconductor device arranged on the wiring substrate, and a unit phosphor structure transferred onto atop surface of the light emitting semiconductor device, The unit phosphor structure may include a phosphor, a phosphor binder configured to fix the phosphor, and a color filter arranged to surround a top surface of the phosphor binder and at least a portion of a side surface of the phosphor binder adjacent to the top surface.

A side surface of the unit phosphor structure may be coated with a reflective film or a color filter.

The unit phosphor structure may include a contact surface wider than the top surface of the light emitting semiconductor device.

In another aspect of the present disclosure, a method of manufacturing a display device using a light emitting semiconductor device may include providing the light emitting semiconductor device on a wiring substrate, positioning a transfer substrate including a unit phosphor structure on the light emitting semiconductor device, and transferring the unit phosphor structure onto the light emitting semiconductor device.

The transferring of the unit phosphor structure onto the light emitting semiconductor device may include forming a unit structure, the unit structure including a first light emitting semiconductor device having a first unit phosphor structure transferred thereto, a second light emitting semiconductor device having a second unit phosphor structure transferred thereto, and a third light emitting semiconductor device without a unit phosphor structure transferred thereto.

The method may further include forming a phosphor side pattern surrounding a side surface of the unit phosphor structure.

The forming of the phosphor side pattern may include coating the phosphor side pattern in a liquid phase, positioning a photomask on the third light emitting semiconductor device and curing the liquid phosphor side pattern arranged on the first and second light emitting semiconductor devices, and developing the liquid phosphor side pattern positioned on the third light emitting semiconductor device.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF THE DISCLOSURE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the light emitting semiconductor device mentioned in this specification is a concept including an LED, a micro LED, and the like, and may be used interchangeably therewith.

Figure 1:
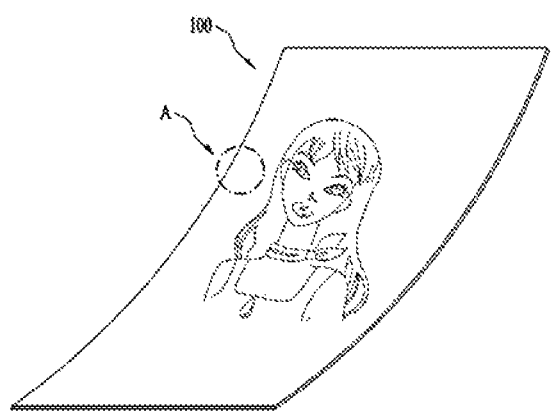
FIG. 1 is a conceptual view illustrating an embodiment of a display device using a light emitting semiconductor device according to the present disclosure.

FIG. 1 is a conceptual View illustrating an embodiment of a display device using a light emitting semiconductor device according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first state is changed, to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a light emitting semiconductor device. In the present disclosure, a light emitting diode (LED) is exemplified as a type of the light emitting semiconductor device configured to convert electric current into light. The LED may be formed in a small size, and may thus serve as a unit pixel even in the second state.

Hereinafter, a flexible display implemented using the LED will be described in more detail with reference to the drawings.

Figure 2:
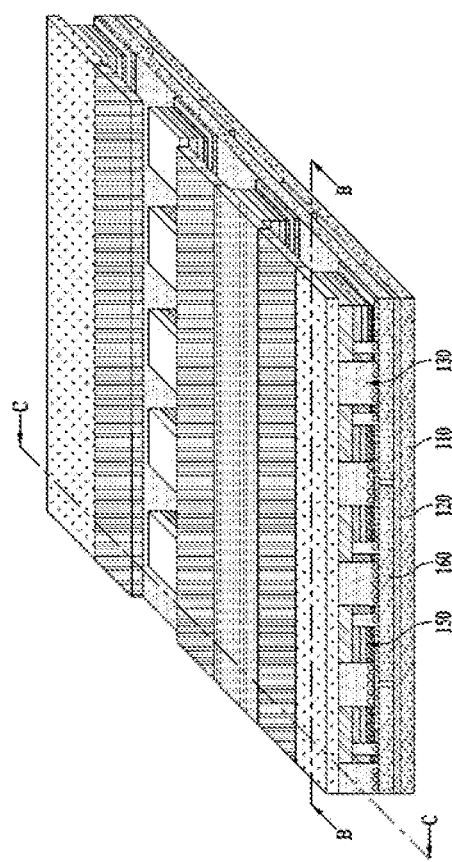
FIG. 2 is a partially enlarged view showing part A of FIG. 1.

FIG. 2 is a partially enlarged view showing part A of FIG. 1.

Figure 3A:
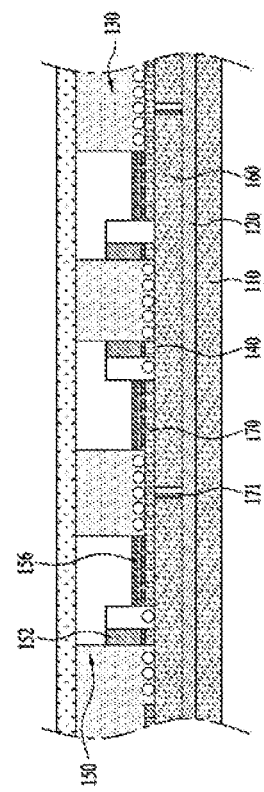
FIGS. 3A and 3B are cross-sectional views taken along lines B-B and C-C in FIG. 2.
Figure 3B:
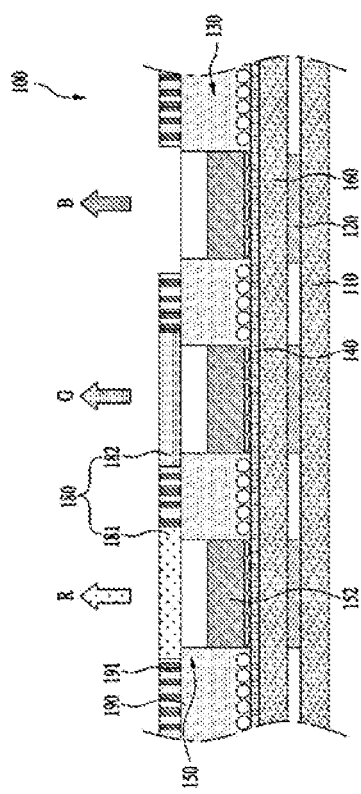

FIGS. 3A and 3B are cross-sectional views taken along lines B-B and C-C in FIG. 2.

Figure 4:
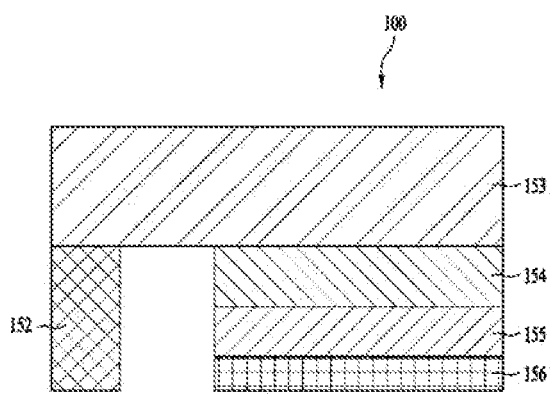
FIG. 4 is a conceptual view illustrating the flip-chip type light emitting semiconductor device of FIG. 3.

FIG. 4 is a conceptual view illustrating the flip-chip type light emitting semiconductor device of FIG. 3.

Figure 5A:
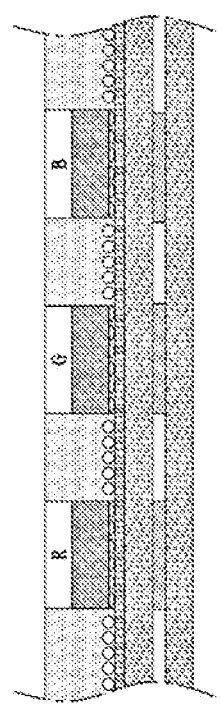
FIGS. 5A to 5C are conceptual views illustrating various examples of implementation of colors in relation to a flip-chip type light emitting semiconductor device.
Figure 5B:
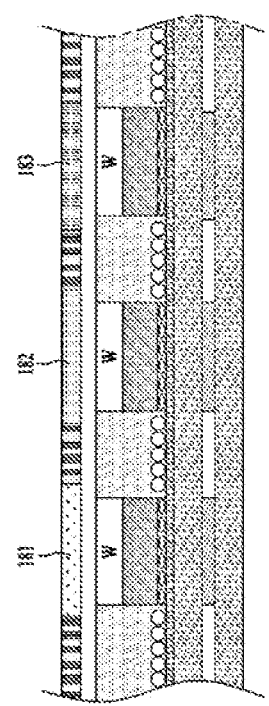
Figure 5C:
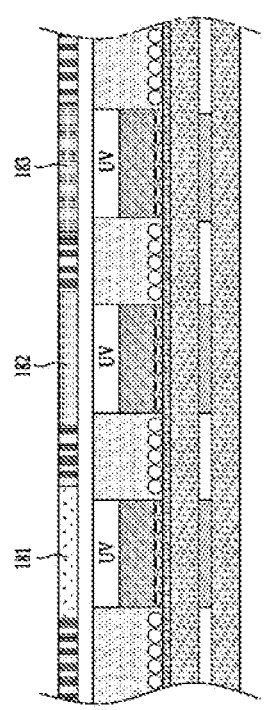

FIGS. 5A to 5C are conceptual views illustrating various examples of implementation of colors in relation to a flip-chip type light emitting semiconductor device.

As shown in FIGS. 2, 3A and 3B, the display device 100 using a passive matrix (PM) type light emitting semiconductor device is exemplified as the display device 100 using a light emitting semiconductor device. However, the examples described below are also applicable to an active matrix (AM) type light emitting semiconductor device.

The display device 100 shown in FIG. 1 may include a substrate 110, a first electrode 120, a conductive adhesive layer 130, a second electrode 140, and at least one light emitting semiconductor device 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the light emitting semiconductor device 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive panicles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the light emitting semiconductor device 150 is connected thereto in a flip-chip form by applying heat and pressure. Thereby, the light emitting semiconductor device 150 is electrically connected to the first electrode 120 and the second electrode 140.

Referring to FIG. 4, the light emitting semiconductor device may be a flip chip-type light emitting device.

For example, the light emitting semiconductor device may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of light emitting semiconductor devices 150. For example, p-type electrodes of light emitting semiconductor devices on left and right sides of an auxiliary electrode may be electrically connected to one auxiliary electrode.

More specifically, the light emitting semiconductor device 150 may be press-fitted into the conductive adhesive layer 130 by heat and pressure. Thereby, only the portions of the light emitting semiconductor device 150 between the p-type electrode 156 and the auxiliary electrode 170 and between the n-type electrode 152 and the second electrode 140 may exhibit conductivity, and the other portions of the light emitting semiconductor device 150 do not exhibit conductivity as they are not press-fitted. In this way, the conductive adhesive layer 130 interconnects and electrically connects the light emitting semiconductor device 150 and the auxiliary electrode 170 and interconnects and electrically connects the light emitting semiconductor device 150 and the second electrode 140.

The plurality of light emitting semiconductor devices 150 may constitute a light emitting device array, and a phosphor conversion layer 180 may be formed on the light emitting device array.

The light emitting device array may include a plurality of light emitting semiconductor devices having different luminance values. Each light emitting semiconductor device 150 may constitute a unit pixel and may be electrically connected to the first electrode 120. For example, a plurality of first electrodes 120 may be provided, and the light emitting semiconductor devices may be arranged in, for example, several columns. The light emitting semiconductor devices in each column may be electrically connected to any one of the plurality of first electrodes.

In addition, since the light emitting semiconductor devices are connected in a flip-chip form, light emitting semiconductor devices grown on a transparent dielectric substrate may be used. The light emitting semiconductor devices may be, for example, nitride light emitting semiconductor devices. Since the light emitting semiconductor device 150 has excellent luminance, it may constitute an individual unit pixel even when it has a small size.

As shown in FIG. 3, a partition wall 190 may be formed between the light emitting semiconductor devices 150. In this case, the partition wall 190 may serve to separate individual unit pixels from each other, and may be integrated with the conductive adhesive layer 130. For example, by inserting the light emitting semiconductor device 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the light emitting semiconductor device 150. For example, the light emitting semiconductor device 150 may be a blue light emitting semiconductor device that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue light emitting semiconductor device at a position of a unit pixel of red color, and the green phosphor 182 capable of converting blue light into green (G) light may be laminated on the blue light emitting semiconductor device at a position of a unit pixel of green color. Only the blue light emitting semiconductor device may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the light emitting semiconductor device 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each light emitting semiconductor device may be implemented as a high-power light emitting device emitting light of various colors including blue by using gallium nitride (GaN) as a main material and adding indium (In) and/or aluminum (Al).

In this case, each light emitting semiconductor device may be a red, green, or blue light emitting semiconductor device to form a unit pixel (sub-pixel). For example, red, green, and blue light emitting semiconductor devices R, G, and B may be alternately disposed, and unit pixels of red, green, and blue may constitute one pixel by the red, green and blue light emitting semiconductor devices. Thereby, a full-color display may be implemented.

Referring to FIG. 5B, the light emitting semiconductor device 150a may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 181, a green phosphor conversion layer 185, and a blue phosphor conversion layer 183 may be provided on a ultraviolet light emitting device. Not only visible light but also ultraviolet (UV) light may be used in the entire region of the light emitting semiconductor device. In an embodiment, UV may be used as an excitation source of the upper phosphor in the light emitting semiconductor device.

Referring back to this example, the light emitting semiconductor device is positioned on the conductive adhesive layer to constitute a unit pixel in the display device. Since the light emitting semiconductor device has excellent luminance, individual unit pixels may be configured despite even when the light emitting semiconductor device has a small size.

Regarding the size of such an individual light emitting semiconductor device, the length of each side of the device may be, for example, 80 μm or less, and the device may have a rectangular or square shape. When the light emitting semiconductor device has a rectangular shape, the size thereof may be less than or equal to 20 μm×80 μm.

In addition, even when a square light emitting semiconductor device having a side length of 10 μm is used as a unit pixel, sufficient brightness to form a display device may be obtained.

Figure 6:
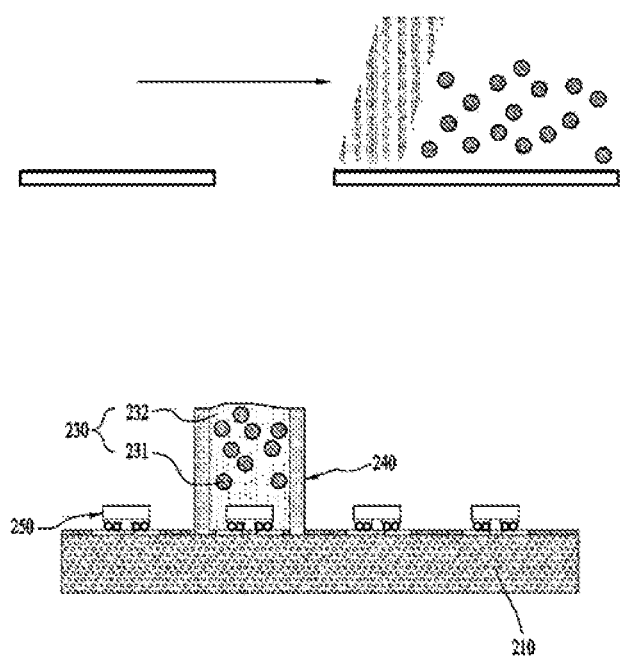
FIG. 6 is a view illustrating a manufacturing method of forming a phosphor structure on a light emitting semiconductor device using a partition wall structure.

FIG. 6 is a diagram illustrating a manufacturing method of forming a phosphor structure 230 on a light emitting semiconductor device 250 using a partition wall structure 240.

A display device according to an exemplary embodiment may include a wiring substrate 210, a light emitting semiconductor device 250 arranged on the wiring substrate 210, a partition wall structure 240 arranged between the light emitting semiconductor devices 250, and a phosphor structure 230 arranged between the partition wall structures 240.

The wiring substrate 210 may include a printed circuit configured to apply an electrical signal to the light emitting semiconductor device 250. Specifically, the wiring substrate 210 may include the substrate 110, the first electrode 120, the second electrode 140, and the insulating layer 160, which are described above.

The light emitting semiconductor device 250 may correspond to a micro LED and may have a size of 5 μm to 100 μm. Here, the light emitting semiconductor device 250 may correspond to the flip-chip type light emitting semiconductor device 150 shown in FIG. 4.

The partition wall structure 240 may be arranged between the light emitting semiconductor devices 250 to define a space to be filled with the phosphor structure 230 and to prevent the phosphor structure 230 from causing color mixing. Additionally, the partition wall structure 240 may serve as a reflective layer or an absorbing layer.

The phosphor structure 230 may be arranged on the light emitting semiconductor device 250 to convert light generated from the light emitting semiconductor device 250 into a different color. Specifically, the phosphor structure 230 may include a phosphor 220 and a phosphor binder 230 configured to fix the phosphor 220.

The phosphor 220 may correspond to at least one of the red phosphor 181, the green phosphor 182, or the blue phosphor 183 described with reference to FIG. 5. The phosphor 220 may be composed of at least one of an organic phosphor, quantum dots, or an inorganic phosphor.

The phosphor binder 230 is configured to fix the phosphor 220 and may be formed of a transparent material. An organic binder or an inorganic color conversion material may be used for the phosphor binder 230. Specifically, as the organic binder, epoxy or silicone-based materials may be mainly used. As the inorganic color conversion material, phosphor ceramic (PC), phosphor glass ceramic (PGC), phosphor in glass (PiG), or bulk glass phosphor (BGP) may be used.

The phosphor structure 230 may be partially coated on the light emitting semiconductor device 250 using inkjet, or a pattern may be formed through a photolithography process. Because of the thixotropy of the phosphor structure 230, the partition wall structure 240 preventing the phosphor structure 230 from spreading may be required. Specifically, FIG. 6 illustrates an embodiment in which the gap between the partition wall structures 240 is filled with the phosphor structures 230 using a squeegee.

The partition wall structure 240 may be formed in a low resolution application. However, it is difficult to form the partition wall structure between the light emitting semiconductor devices 250 in a high resolution application having a cell period of less than 100 μm.

As a solution to this issue, a transfer substrate including the phosphor structure 230 as a unit structure and a method of manufacturing a display device using the same will be described below.

FIGS. 7A to 7E are views illustrating a phosphor structure transfer substrate. The phosphor structure transfer substrate is a transfer substrate used for manufacturing a display device using light emitting semiconductor devices. FIGS. 7A to 7E show different embodiments of the phosphor structure 230.

The transfer substrate used for manufacturing a display device using light emitting semiconductor devices may include a base substrate 310, and a phosphor conversion layer 320 arranged on the base substrate 310, the phosphor conversion layer 320 including divided unit phosphor structures 230 transferred onto the light emitting semiconductor device 250.

The base substrate 310 is a substrate on which the phosphor conversion layer 320 is laminated, and may serve as a temporary substrate or a donor for transferring the phosphor structures 230.

The phosphor conversion layer 320 may include a plurality of phosphor structures 230 as unit structures. The phosphor structures may be separated from each other and independently arranged. Each unit phosphor structure 230 may be transferred onto the light emitting semiconductor device 250 in a one-to-one correspondence manner (see FIG. 6).

Specifically, a plurality of unit phosphor structures 230 may be arranged along at least one row and at least one column on the base substrate 310. The unit phosphor structure 230 may be arranged spaced apart from another adjacent unit phosphor structure 230 by a predetermined distance.

Figure 7A:
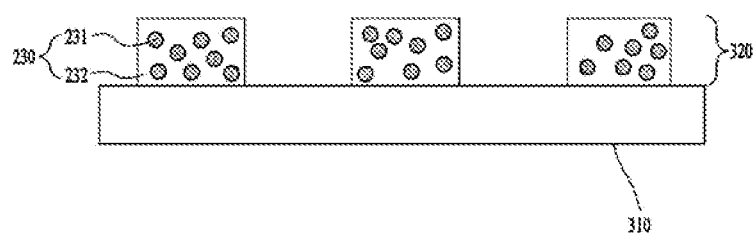
FIGS. 7A to 7E are views illustrating a phosphor structure transfer substrate.

As shown in FIG. 7A, the unit phosphor structure 230 may include a phosphor 231 and a phosphor binder 232 configured to fix the phosphor 231.

Figure 7B:
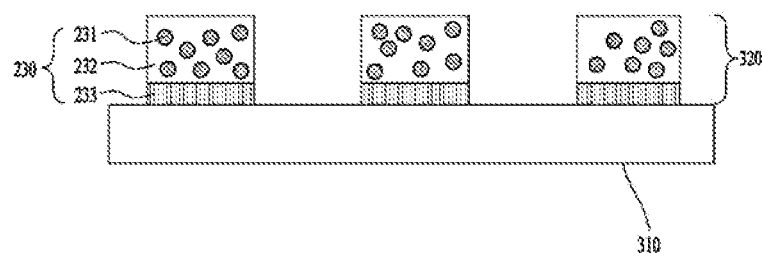

As shown in FIG. 7B, the unit phosphor structure 230 may further include a color filter 233 arranged between the base substrate 310 and the phosphor binder 232. The unit phosphor structure 230 may be transferred onto the light emitting semiconductor device 250 (see FIG. 6) such that the color filter 233 forms the top surface.

The color filter 233 may allow light of a specific wavelength to pass therethrough. The color filter 233 may prevent the light emitted from the light emitting semiconductor device 250 from being mixed with the light whose wavelength is converted through the phosphor 231. The filter may block the wavelength of light generated by the light emitting semiconductor device 250 (see FIG. 6), and allow the wavelength of light changed through the phosphor 231 to pass therethrough. For example, when the light emitting semiconductor device 250 generates blue light and the phosphor 231 changes blue light into red light, the color filter 233 may block blue light and allow red light to pass therethrough. The color filter 233 may generate red light using a light emitting semiconductor device (the light emitting semiconductor device 250 emitting blue light).

The color filter 233 may be discretely arranged like the unit phosphor structure 230. However, in some cases, the color filter 233 may be integrally laminated on the base substrate 310 in a film structure. When the color filter 233 is integrally provided, it may be discretely arranged according to the unit structure when the phosphor structure 230 is transferred onto the light emitting semiconductor device 250. Specifically, when a laser having a wavelength of 300 nm or less is used during lift-off, the color filter 233 may absorb the laser to be separated and discretely arranged.

Figure 7C:
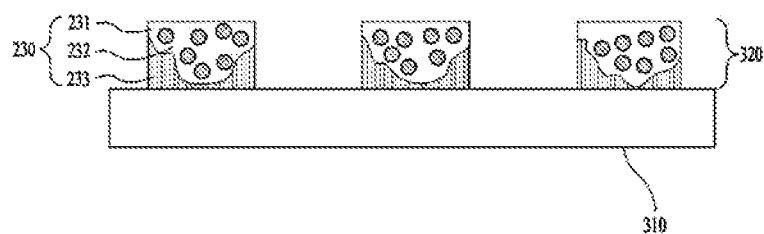

As shown in FIG. 7C, the color filter 233 may be arranged to surround the contact surface of the phosphor structure 230 (or the phosphor binder 232) facing the base substrate 310 and at least a portion of the side surface of the phosphor structure 230 (or the phosphor binder 232) adjacent to the contact surface. That is, the color filter 233 may be arranged to surround the upper layer of the phosphor structure 230 laminated on the light emitting semiconductor device 250. The color filter 233 having the above structure may filter not only light emitted from the light emitting semiconductor device 250 in the forward direction, but also light emitted in an oblique direction.

Figure 7D:
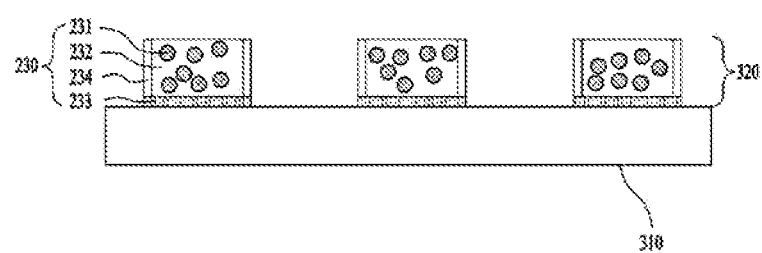

As shown in FIG. 7D, the side surface of the unit phosphor structure 230 may be coated with a reflective film 234. Here, the reflective film 234 may prevent light incident onto the phosphor structure 230 from the light emitting semiconductor device 250 from exiting through the side surface. In some cases, the reflective film 234 may be a component of the color filter 233.

Figure 7E:
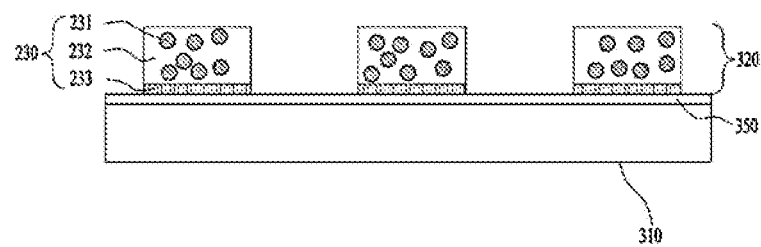

The transfer substrate used for manufacturing a display device using light emitting semiconductor devices may further include a light absorption layer 350, as shown in FIG. 7E. The light absorption layer 350 may be arranged between the color filter 233 and the base substrate 310. The light absorption layer 350 may prevent damage to the color filter 233 during the lift-off process. In addition, the light absorption layer 350 may facilitate separation of the transfer substrate and the color filter during the lift-off process. Specifically, the color filter 233 may be segmented in the light absorption layer 350 during the lift-off process, and the phosphor structure 230 may be transferred onto the light emitting semiconductor device 250.

Hereinafter, a method of manufacturing the transfer substrate of the phosphor structure 230 will be described.

Figure 8:
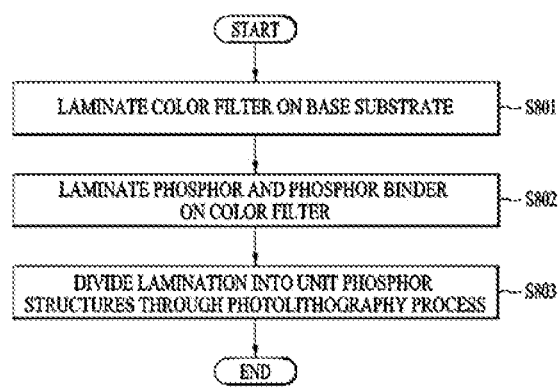
FIGS. 8 and 9 illustrate a method of manufacturing a phosphor structure transfer substrate according to an embodiment.
Figure 9:
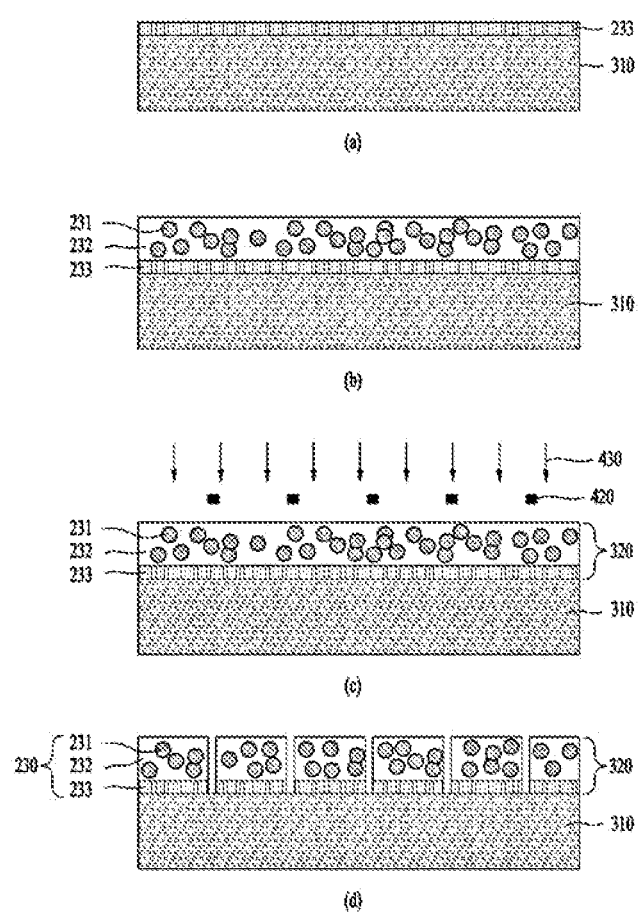

FIGS. 8 and 9 illustrate a method of manufacturing a transfer substrate of the phosphor structure 230 according to an embodiment.

The method of manufacturing the transfer substrate of the phosphor structure 230 may include forming a color filter 233 on the base substrate 310 (S801). Here, the color filter 233 may be laminated on the base substrate 310 in the form of a film (see 9-(a)).

The method of manufacturing the transfer substrate of the phosphor structure 230 may include laminating a phosphor 231 and a phosphor binder 232 on the color filter 233 (S802). The phosphor 231 may include at least one of an organic phosphor, quantum dots, or an inorganic phosphor. The phosphor 231 may have a size within a predetermined diameter, and a plurality of phosphors 231 may be fixed by the phosphor binder 232. Specifically, the phosphor binder 232 may be formed of a transparent material and have the phosphors 231 therein (see FIG. 9-(b)). Also, the phosphor binder 232 may be formed of an adhesive material.

The color filter 233, the phosphor 231, and the phosphor binder 232 may constitute the phosphor layer 320. The method of manufacturing the transfer substrate of the phosphor structure 230 may include dividing the phosphor layer 320 into unit phosphor structures through a photolithography process (S803). Specifically, a mask 420 may be formed on the phosphor layer 320 at regular intervals and partially cured by radiating UV 430 thereon (see FIG. 9-(c)). Portions except the cured phosphor layer may be removed through a subsequent photolithography process. Here, the partially cured phosphor layer 320 may form segmented unit phosphor structures 230. The color filter 233 may also be partially removed and segmented during the photolithography process (see FIG. 9-(d)).

In the phosphor structure 230 formed according to an embodiment, the color filter 233 may be arranged on only one surface of the phosphor structure 230 (specifically, a surface corresponding to the top surface when the color filter 233 is transferred onto the semiconductor structure 250). However, in this case, light emitted from the semiconductor structure 250 in an oblique direction other than the forward direction may not be filtered. Hereinafter, a method of manufacturing a transfer substrate of the phosphor structure 230 capable of filtering light emitted from the semiconductor structure 250 in an oblique direction other than the forward direction will be described.

Figure 10:
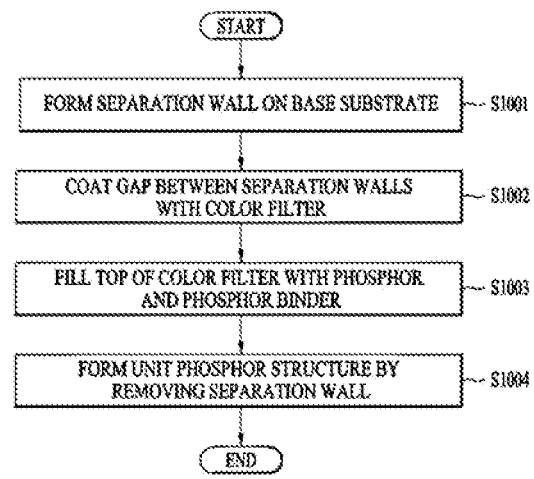
FIGS. 10 and 11 illustrate a method of manufacturing a phosphor structure transfer substrate according to another embodiment.
Figure 11:
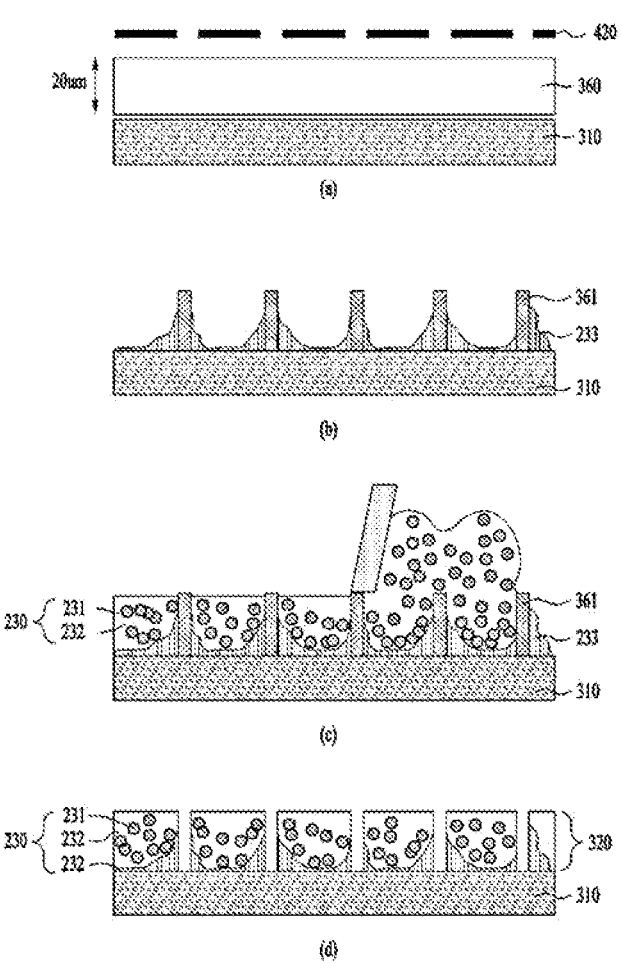

FIGS. 10 and 11 illustrate a method of manufacturing a transfer substrate of the phosphor structure 230.

The method of manufacturing the transfer substrate of the phosphor structure 230 may include forming a separation wall 361 on the base substrate 310 (S1001). The separation wall 361 may be formed on the base substrate 310 in a grid pattern. The operation of forming the separation wall 361 may include laminating a sacrificial layer 360 on the base substrate 310, arranging a photomask on the sacrificial layer 360 at a position corresponding to the position of the separation wall 361, partially curing the sacrificial layer 360, and developing the uncured part of the sacrificial layer 360 excluding the separation wall 361 (see FIG. 11-(a)).

The method of manufacturing the transfer substrate of the phosphor structure 230 may include coating a gap between the partition walls 361 with the color filter 233 (S1002). In this case, the color filter 233 may be coated on a surface in contact with the base substrate 310, and on a side surface of the separation wall 361 together with the surface in contact with the base substrate 310. Specifically, it may be coated on a lower side surface of the separation wall 361. Specifically, the color filter 233 may be coated in a concave shape between the partition walls 361 (see FIG. 11-(b)). The color filter 233 may be provided to surround, on one side, the phosphor 231 and the phosphor binder 232 that is to fill the gap later.

The method of manufacturing the transfer substrate of the phosphor structure 230 may include filling the top of the color filter 233 with the phosphor 231 and the phosphor binder 232 (S1003). At this time, the phosphor 231 may be in a solid state, and the phosphor binder 232 may be in a liquid state. The gap between the partition walls 261 may be filled with the phosphor 231 and the phosphor binder 232 in a squeegee manner (see FIG. 11-(c)).

The method of manufacturing the transfer substrate of the phosphor structure 230 may include forming the unit phosphor structure 230 by removing the separation walls 361 (S1004). The separation walls 361 may be removed using an etching solution. Once the separation walls 361 are removed, the unit phosphor structures 230 may be spaced apart from each other on the base substrate 310. Thereby, the phosphor layer 320 may be formed (see FIG. 11-(d)).

Figure 12:
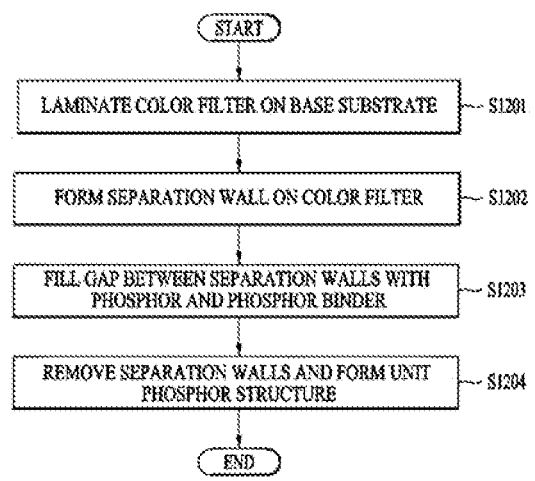
FIGS. 12 and 13 illustrate a method of manufacturing a phosphor structure transfer substrate according to still another embodiment.
Figure 13:
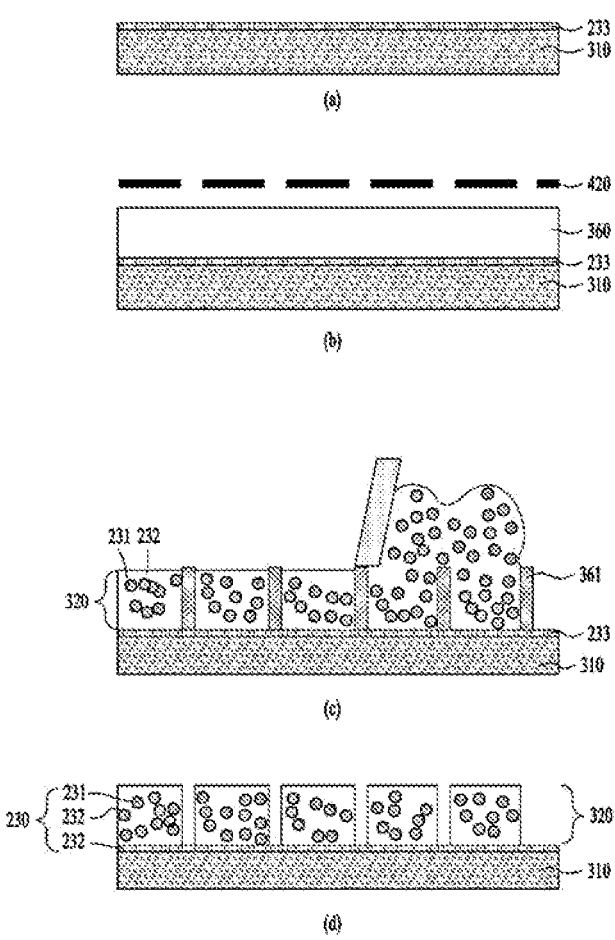

FIGS. 12 and 13 illustrate a method of manufacturing a transfer substrate of the phosphor structure 230 according to still another embodiment.

The method of manufacturing the transfer substrate of the phosphor structure 230 may include forming a color filter 233 on the base substrate 310 (S1201). Here, the color filter 233 may be laminated on the base substrate 310 in the form of a film (see FIG. 13-(a)).

The method of manufacturing the transfer substrate of the phosphor structure 230 may include forming a separation wall 361 on the color filter 233 (S1202). The separation wall 361 may be formed on the base substrate 310 in a grid pattern. The operation of forming the separation wall 361 may include laminating a sacrificial layer 360 on the color filter 233, arranging a photomask 420 on the sacrificial layer 360 at a position corresponding to the position where the separation wall 361 is to be formed, partially curing the sacrificial layer 360, and developing the uncured part of the sacrificial layer 360 excluding the separation wall 361 (see FIG. 13-(b)).

The method of manufacturing the transfer substrate of the phosphor structure 230 may include filling a gap between the partition walls 361 with the phosphor 231 and the phosphor binder 232 (S1203). At this time, the phosphor 231 may be in a solid state, and the phosphor binder 232 may be in a liquid state. The gap between the partition walls 261 may be filled with the phosphor 231 and the phosphor binder 232 in a squeegee manner (see FIG. 13-(c)).

The method of manufacturing the transfer substrate of the phosphor structure 230 may include forming the unit phosphor structure 230 by removing the separation walls 361 (S1204). The separation walls 361 may be removed using an etching solution. Once the separation walls 361 are removed, the unit phosphor structures 230 may be spaced apart from each other on the base substrate 310. Thereby, the phosphor layer 320 may be formed (see FIG. 11-(d)). At this time, the color filter 233 may remain unseparated. The color filter 233 may have a thickness of 2 μm or less, and may be segmented through selective separation of the unit phosphor structure 230 in the LLO process.

In this case, the unit phosphor structure 230 may be manufactured to have a thickness of 100 μm or less. For example, the unit phosphor structure 230 may be manufactured to have a height of about 20 μm. Also, the unit phosphor structure 230 may have a width corresponding to that of the light emitting semiconductor device 250 (see FIG. 6) having a size of several tens of micrometers. However, the microscopic size of the above-described unit phosphor structure may raise an issue when the phosphor 231 is an inorganic phosphor. Hereinafter, the diameter size of the phosphor 231 used in the present disclosure, specifically the inorganic phosphor will be described.

Figure 14:
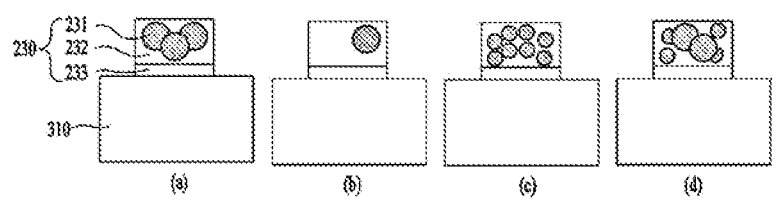
FIG. 14 is a view illustrating a diameter size of an inorganic phosphor contained in a unit phosphor structure.

FIG. 14 is a view illustrating a diameter size of an inorganic phosphor included in the unit phosphor structure 230.

The unit phosphor structure 230 of the present disclosure may include a phosphor 231 and a phosphor binder 232 configured to bind a plurality of phosphors 231. The phosphor 231 may include at least one of an organic phosphor, quantum dots, or an inorganic phosphor.

The inorganic phosphor may exhibit excellent conversion efficiency when it has a diameter of 15 μm or more. However, it may be difficult to manufacture the phosphor structure 230 having a size of several tens of micrometers using the inorganic phosphor whose diameter is greater than or equal to 15 μm. In the process of FIG. 13(c), it may be difficult to uniformly fill the space between the separation walls 361 with the inorganic phosphor.

Specifically, FIG. 14-(a) illustrates a case where the unit phosphor structure 230 is uniformly filled with the inorganic phosphor having a first diameter, and FIG. 14-(b) illustrates a case where the unit phosphor structure 230 is non-uniformly filled with the inorganic phosphor. Non-uniformly filling the unit phosphor structure 230 with the phosphor may cause a difference in luminance among parts of the light emitting surface. When the inorganic phosphor is formed to be excessively small to address the aforementioned issue, color conversion efficiency may be degraded.

Accordingly, the inorganic phosphor included in the unit phosphor structure 230 may have a diameter of 20 μm or less. The diameter of the inorganic phosphor may be less than or equal to 20 μm or and greater than or equal to 5 μm. Preferably, the diameter of the inorganic phosphor may be 5 μm. FIG. 14-(c) illustrates a case where the unit phosphor structure 230 is uniformly filled with inorganic phosphors having a second diameter smaller than the first diameter. Here, the second diameter may be the maximum size allowing the gap between the partition walls 361 to be uniformly filled with the inorganic phosphors.

In some cases, the unit phosphor structure 230 may include inorganic phosphor structures having different diameters. For example, one inorganic phosphor may have a diameter of 20 µm, and another inorganic phosphor may have a diameter of 5 µm. FIG. 14-(*d*) shows a unit phosphor structure 230 including an inorganic phosphor having a first diameter and an inorganic phosphor having a second diameter. The inorganic phosphor having the larger diameter may enhance color conversion efficiency, and the inorganic phosphor having the smaller diameter may reduce the difference in luminance.

Figure 15:
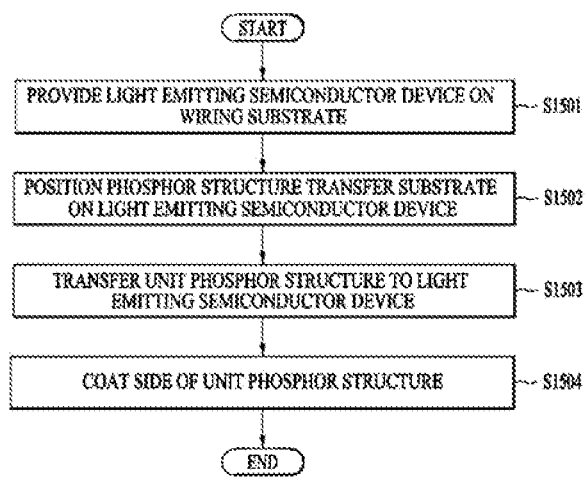
FIGS. 15 to 17 are views illustrating a process of manufacturing a display using a phosphor structure transfer substrate.
Figure 16:
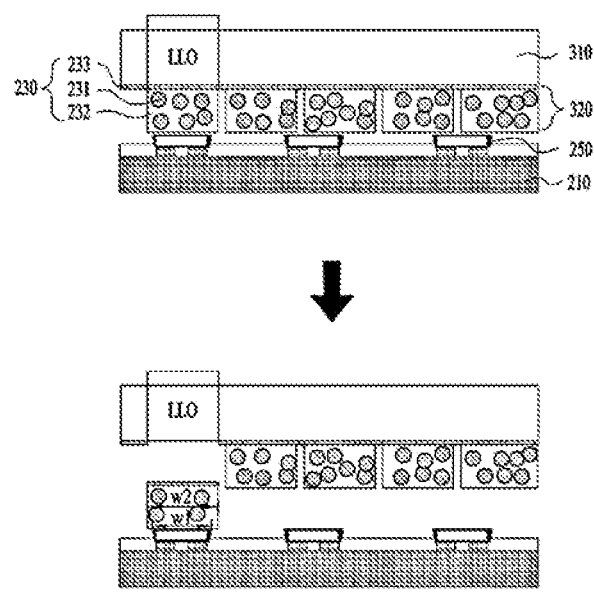
Figure 17:
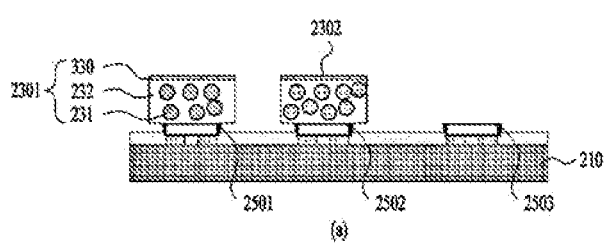
Figure 17:
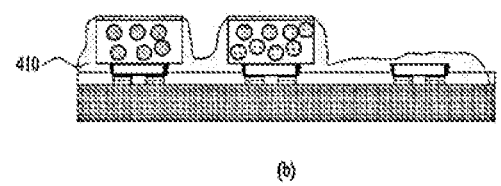
Figure 17:
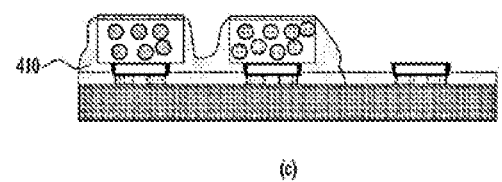

FIGS. 15 to 17 are views illustrating a process of manufacturing a display using a phosphor structure transfer substrate A method of manufacturing a display device using a light emitting semiconductor device may include providing a light emitting semiconductor device 250 on a wiring substrate 210 (S1501). Thereafter, in the method of manufacturing a display device using the light emitting semiconductor device, a phosphor structure transfer substrate may be positioned on the light emitting semiconductor device (S1502). Here, the phosphor structure transfer substrate is a transfer substrate having a phosphor layer 320 laminated on the base substrate 310, and the phosphor layer 320 may include a segmented unit phosphor structure 230 (see FIG. 16). In this case, the phosphor structure transfer substrate may be positioned such that the phosphor layer 320 faces the light emitting semiconductor device 250.

The method of manufacturing a display device using a light emitting semiconductor device may include transferring the unit phosphor structure 230 to the light emitting semiconductor device 250 (S1503). The unit phosphor structure 230 may be transferred onto the light emitting semiconductor device 250 in a one-to-one correspondence manner. The unit phosphor structure 230 may include a phosphor 231, a phosphor binder 232, and a color filter 233. The unit phosphor structure 230 may be transferred onto the light emitting semiconductor device 250 such that the color filter 233 forms a top surface.

In this case, the unit phosphor structure 230 may have a contact surface wider than width w1 of the light emitting surface of the light emitting semiconductor device 250. That is, the width w2 of the contact surface of the unit phosphor structure 230 that contacts the light emitting semiconductor device 250 may be greater than the width w1 of the light emitting surface of the light emitting semiconductor device 250. Thus, the unit phosphor structure 230 may be transferred onto completely cover the light emitting surface of the light emitting semiconductor device 250 in the transfer operation (see FIG. 16).

The transferring of the unit phosphor structure 230 may include transferring a first unit phosphor structure 2301 to a first light emitting semiconductor device 2501, transferring a second unit phosphor structure 2302 to a second light emitting semiconductor device 2502, and omitting the transfer of the unit phosphor structure onto a third light emitting semiconductor device 2503. Specifically, the first to third light emitting semiconductor devices 2501 to 2503 may generate light of the same specific wavelength, the first unit phosphor structure 2301 may convert the specific wavelength into light of a first wavelength, and the second unit phosphor structure 2302 may convert the specific wavelength into light of a second wavelength. For example, the first to third light emitting semiconductor devices 2501 to 2503 may generate blue light, the first light emitting semiconductor device 2301 may convert the blue light into red light, and the second light emitting semiconductor device 2302 may convert the blue light into green light (see FIG. 17-(*a*))

The method of manufacturing a display device using a light emitting semiconductor device may further include coating a side surface of the unit phosphor structure (S1504). A phosphor side pattern coated on the side surface of the unit phosphor structure 230 may be a reflective film or a color filter. The operation of coating the side surface of the unit phosphor structure may include an operation of coating a liquid phosphor side pattern 410, an operation of positioning a photo mask 420 on the third light emitting semiconductor device 2503 and curing the liquid side pattern provided on the first and second light emitting semiconductor devices 2501 and 2502 (see FIG. 17-(*b*)), and developing the liquid phosphor side pattern positioned on the third light emitting semiconductor device 2503 (see FIG. 17-(*c*)).

Figure 18:
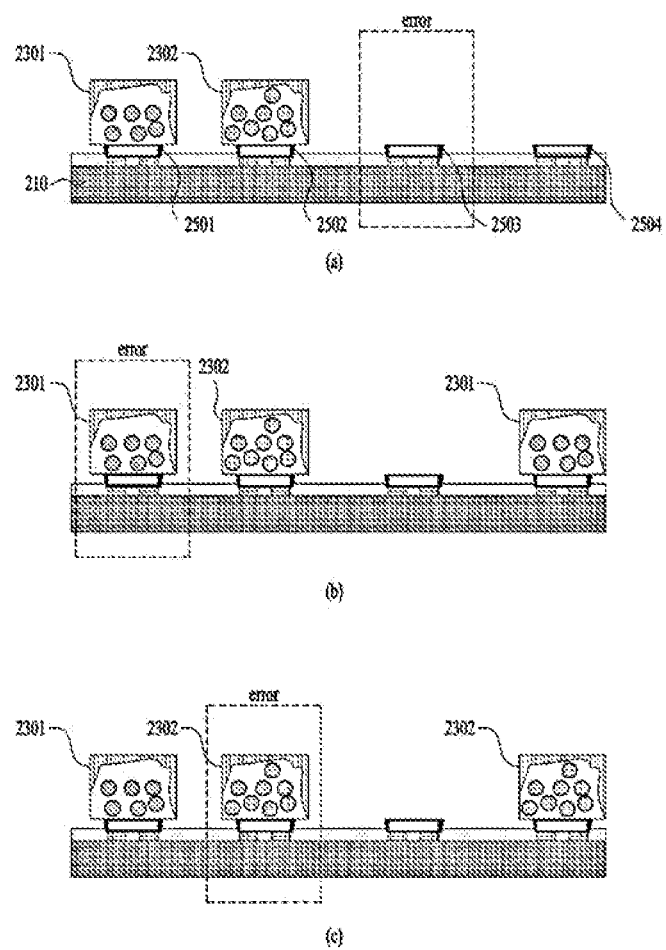
FIG. 18 is a view illustrating a method of correcting a defective pixel using a phosphor structure transfer substrate.

FIG. 18 is a view illustrating a method of correcting a defective pixel using a phosphor structure transfer substrate.

A display device using a light emitting semiconductor device may include a plurality of pixels, and each of the pixels may include a light emitting device configured to emit green, red, or blue light. When at least one color of green, red, and blue has a problem in light emission, color realization may fail. Accordingly, in conventional cases, one more light emitting device to emit green, red, or blue light is redundantly provided to each pixel. However, in this case, the size of one pixel is increased.

The display device using a light emitting semiconductor device according to an embodiment may include one redundant light emitting semiconductor device 2504 in addition to the first to third light emitting semiconductor devices 2501 to 2503 in one pixel.

In the display device using the light emitting semiconductor device according to an embodiment, a first unit phosphor structure 2301 may be transferred onto a first light emitting semiconductor device 2501, and a second unit phosphor structure 2301 may be transferred onto a second light emitting semiconductor device 2502. Then, a defective light emitting device may be inspected.

In the display device using the light emitting semiconductor device according to an embodiment, when the third light emitting semiconductor device 2503 is defective, the redundant light emitting semiconductor device 2504 may be used as the third light emitting semiconductor device 2503 (see FIG. 18-(*a*)).

In the display device using the light emitting semiconductor device, when the first light emitting semiconductor device 2501 is defective or the wavelength of light generated through the first unit phosphor structure does not fall within a preset wavelength range, the first unit phosphor structure 2301 may be transferred onto the redundant semiconductor light device 2504, and the redundant light emitting semiconductor device 2504 may be used as the first light emitting semiconductor device 2501.

In the display device using the light emitting semiconductor device according to an embodiment, when the second light emitting semiconductor device 2502 is defective or the wavelength of light generated through the second unit phosphor structure does not fall within a preset wavelength range, the second unit phosphor structure 2302 may be transferred onto the redundant light emitting semiconductor device 2504, and the redundant light emitting semiconductor device 2504 may be used as the second light emitting semiconductor device 2502.

In the display device using the light emitting semiconductor device according to an embodiment, the number of redundant light emitting semiconductor devices 2504 may be reduced from the existing maximum of three to one by forming one pixel by transferring the first unit phosphor structure 2301 and the second unit phosphor structure 2302. This method may be effective in reducing the size of a pixel.

As described above, according to an embodiment of the present disclosure, a transfer substrate including a unit phosphor structure on which divisional transfer can be performed may be formed without a separate partition wall structure.

As apparent from the above description, the present disclosure has effects as follows.

According to an embodiment of the present disclosure, with a transfer substrate used for manufacturing a display device, a phosphor structure having a partition wall structure may be formed even for high-resolution applications.

In addition, as a phosphor structure capable of being divided and transferred is provided, the number of transfers of the LED device may be reduced, and thus defects may be reduced.

Furthermore, the number of redundant cells provided for replacement of defective cells may be reduced.

According to an embodiment of the present disclosure, in a display device using a light emitting semiconductor device, a phosphor pattern may be formed.

According to another embodiment of the present disclosure, there are additional technical effects not mentioned herein. The other effects will also be apparent to those skilled in the art from the whole spirit of the specification and drawings.

The above description is merely illustrative of the technical spirit of the present disclosure. It will be apparent to those skilled in the art that various modifications and variations can be made in the present disclosure without departing from the spirit and scope of the disclosure.

Therefore, the embodiments disclosed in the present disclosure are merely illustrative of the technical spirit of the present disclosure. The scope of the technical spirit of the present disclosure is not limited by these embodiments. The scope of the present disclosure should be construed by the appended claims, and all technical ideas within the scope equivalent thereto should be construed as being within the scope of the present disclosure.

What is claimed is:

1. A transfer substrate used for manufacturing a display device using a light emitting semiconductor device, the transfer substrate comprising:
   a base substrate; and
   a phosphor conversion layer arranged on the base substrate, the phosphor conversion layer including a plurality of divided unit phosphor structures configured to be transferred onto the light emitting semiconductor device,
   wherein each divided unit phosphor structure is laterally detached from an adjacent divided unit phosphor structure from among the plurality of divided unit phosphor structures.

2. The transfer substrate of claim 1, wherein the each unit phosphor structure comprises:
   a phosphor;
   a phosphor binder configured to fix the phosphor; and
   a color filter arranged between the base substrate and the phosphor binder.

3. The transfer substrate of claim 2, wherein the color filter is arranged to surround a contact surface of the phosphor binder facing the base substrate and at least a portion of a side surface of the phosphor binder adjacent to the contact surface.

4. The transfer substrate of claim 2, wherein the phosphor comprises at least one of an organic phosphor, quantum dots, or an inorganic phosphor.

5. The transfer substrate of claim 4, wherein the inorganic phosphor has a size less than or equal to 20 μm and greater than or equal to 5 μm.

6. The transfer substrate of claim 1, wherein a side surface of the each unit phosphor structure is coated with a reflective film or a color filter.

7. The transfer substrate of claim 1, further comprising:
   a light absorption layer arranged between the each unit phosphor structure and the base substrate.

8. The transfer substrate of claim 1, wherein the each divided unit phosphor structure and the adjacent divided unit phosphor structure are without a separation wall interposed therebetween.

9. A display device using a light emitting semiconductor device, the display device comprising
   a wiring substrate;
   a plurality of light emitting semiconductor devices arranged on the wiring substrate; and
   a plurality of unit phosphor structures transferred onto a top surface of the plurality of light emitting semiconductor devices, respectively,
   wherein each unit phosphor structure is laterally detached from an adjacent unit phosphor structure from among the plurality of unit phosphor structures.

10. The display device of claim 9, wherein the each unit phosphor structure comprises:
    a phosphor;
    a phosphor binder configured to fix the phosphor; and
    a color filter arranged to surround a top surface of the phosphor binder and at least a portion of a side surface of the phosphor binder adjacent to the top surface.

11. The display device of claim 9, wherein a side surface of the each unit phosphor structure is coated with a reflective film or a color filter.

12. The display device of claim 8, wherein the each unit phosphor structure includes a contact surface wider than the top surface of one of the plurality of light emitting semiconductor devices.

13. The display device of claim 9, wherein the each unit phosphor structure and the adjacent unit phosphor structure are without a separation wall interposed therebetween.

* * * * *